United States Patent
Cowles et al.

(10) Patent No.: US 7,289,384 B2
(45) Date of Patent: Oct. 30, 2007

(54) METHOD FOR WRITING TO MULTIPLE BANKS OF A MEMORY DEVICE

(75) Inventors: Timothy B. Cowles, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 10/850,011

(22) Filed: May 19, 2004

(65) Prior Publication Data

US 2004/0218418 A1  Nov. 4, 2004

Related U.S. Application Data

(60) Continuation of application No. 10/338,331, filed on Jan. 6, 2003, now Pat. No. 6,754,118, which is a division of application No. 09/925,237, filed on Aug. 8, 2001, now Pat. No. 6,529,429, which is a continuation of application No. 09/546,683, filed on Apr. 10, 2000, now Pat. No. 6,278,648, which is a continuation of application No. 09/388,086, filed on Aug. 30, 1999, now Pat. No. 6,049,502, which is a continuation of application No. 08/999,389, filed on Dec. 29, 1997, now Pat. No. 5,959,929.

(51) Int. Cl.
*G11C 8/00* (2006.01)

(52) U.S. Cl. ............. 365/230.03; 365/230; 365/230.01

(58) Field of Classification Search ........... 365/189.04, 365/235, 230.003, 201, 203, 193, 230.03, 365/233

See application file for complete search history.

(56) References Cited

U.S. PATENT DOCUMENTS

| | | | | |
|---|---|---|---|---|
| 4,542,454 A | * | 9/1985 | Brcich et al. | 365/222 |
| 4,799,186 A | * | 1/1989 | Ployette | 711/152 |
| 4,866,603 A | * | 9/1989 | Chiba | 711/157 |
| 4,912,698 A | * | 3/1990 | Bitzinger et al. | 370/244 |
| 5,386,385 A | | 1/1995 | Stephens | 365/189.05 |
| 5,390,308 A | | 2/1995 | Ware et al. | 711/5 |
| 5,430,676 A | | 7/1995 | Ware et al. | 365/189.02 |
| 5,434,817 A | | 7/1995 | Ware et al. | 365/189.01 |
| 5,446,691 A | * | 8/1995 | North et al. | 365/189.02 |

(Continued)

OTHER PUBLICATIONS

Dram Data Book, Micron Technology, Inc., 1997.

(Continued)

*Primary Examiner*—Thong Q. Le
(74) *Attorney, Agent, or Firm*—TraskBritt

(57) ABSTRACT

In a multi-bank memory system such as a synchronous dynamic random access memory (SDRAM), a method of writing data to the banks is provided. This method allows for writing to any number of banks. More particularly, this method allows for writing to a selected number of banks between one and all banks. In addition, the method retains the discrete nature of the selected banks by allowing any row in each bank to be accessed regardless of the rows activated in other banks. As a result, rows of different memory banks that are intended to store similar data may be accessed simultaneously for purposes of writing the data in test and non-test modes. This allows for quicker writing to the SDRAM without the errors that may be created by other fast writing modes, such as data compression.

7 Claims, 18 Drawing Sheets

U.S. PATENT DOCUMENTS

| | | | |
|---|---|---|---|
| 5,450,364 A | | 9/1995 | Stephens et al. ............ 365/222 |
| 5,511,024 A | | 4/1996 | Ware et al. ............ 365/189.04 |
| 5,511,029 A | * | 4/1996 | Sawada et al. ............ 365/201 |
| 5,600,605 A | | 2/1997 | Schaefer ..................... 365/233 |
| 5,636,173 A | * | 6/1997 | Schaefer ............... 365/230.03 |
| 5,673,233 A | | 9/1997 | Wright et al. ............... 365/233 |
| 5,805,854 A | | 9/1998 | Shigeeda ....................... 711/1 |
| 5,835,435 A | | 11/1998 | Bogin et al. ................ 365/227 |
| 5,841,726 A | | 11/1998 | Williams et al. ....... 365/230.03 |
| 5,930,196 A | * | 7/1999 | Yim ...................... 365/230.06 |
| 5,940,342 A | | 8/1999 | Yamazaki et al. ..... 365/230.03 |
| 5,950,220 A | * | 9/1999 | Quach .......................... 711/5 |
| 5,953,280 A | * | 9/1999 | Matsui ................. 365/230.03 |
| 5,959,911 A | | 9/1999 | Krause et al. .............. 365/201 |
| 5,959,929 A | | 9/1999 | Cowles et al. ......... 365/230.03 |
| 6,049,502 A | | 4/2000 | Cowles et al. ......... 365/230.03 |
| 6,067,632 A | | 5/2000 | Yamaguchi ................ 713/600 |

OTHER PUBLICATIONS

Dram Data Book, Micron Technology, Inc., 1996.
Synchronous Dram: Functional Specification, 4M x 16 SDRAM, Quad Bank, Pipelined, 3.3V Operation, Micron Technology, Inc., 1997, pp. 1-47.
400 Mb/s/PIN SLDRAM: Functional Specfication, 4M x 18 SLDRAM, Pipelined, Eight Bank, 2.5V Operation, Micron Technology, Inc., 1997, pp. 1-59.

* cited by examiner

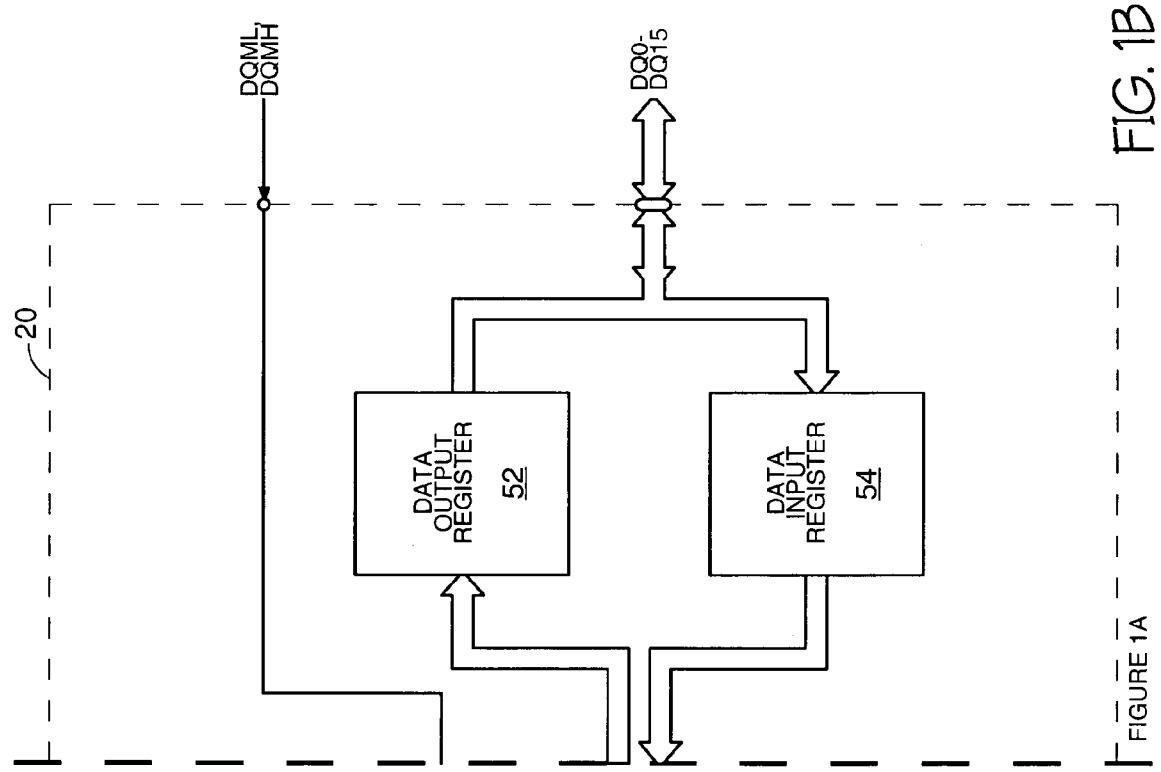

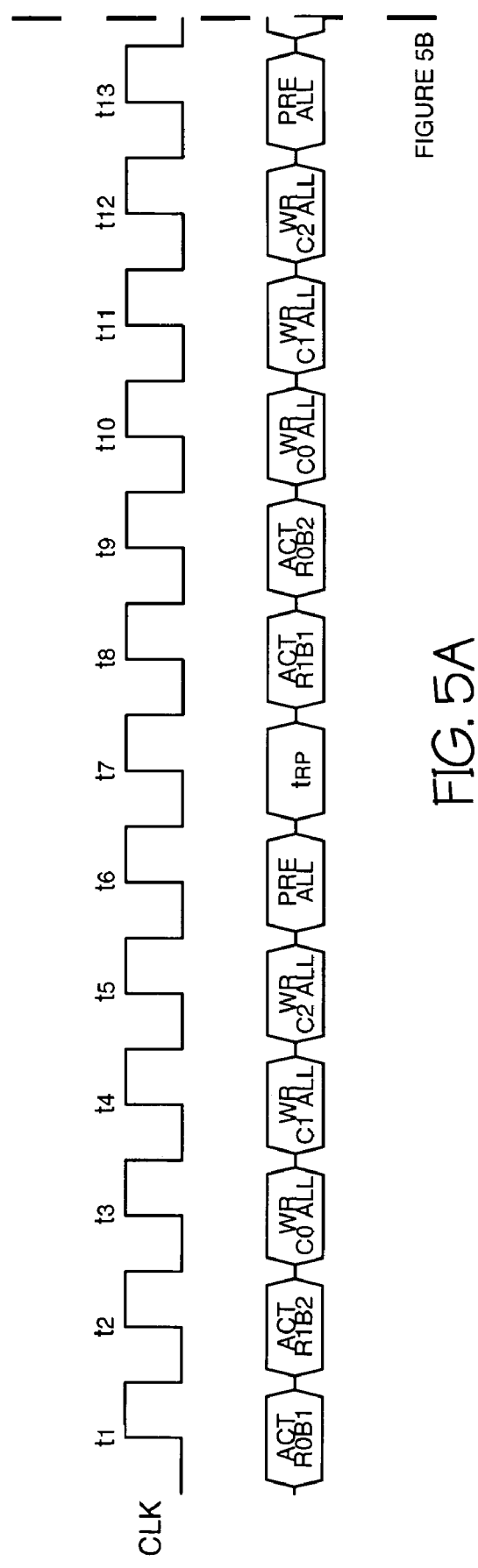

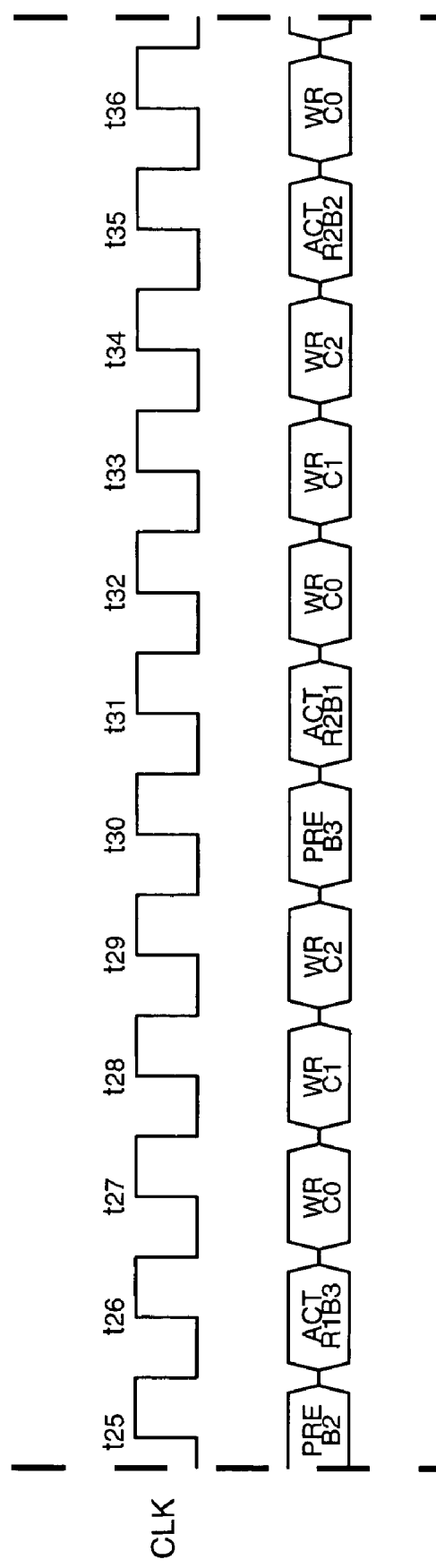

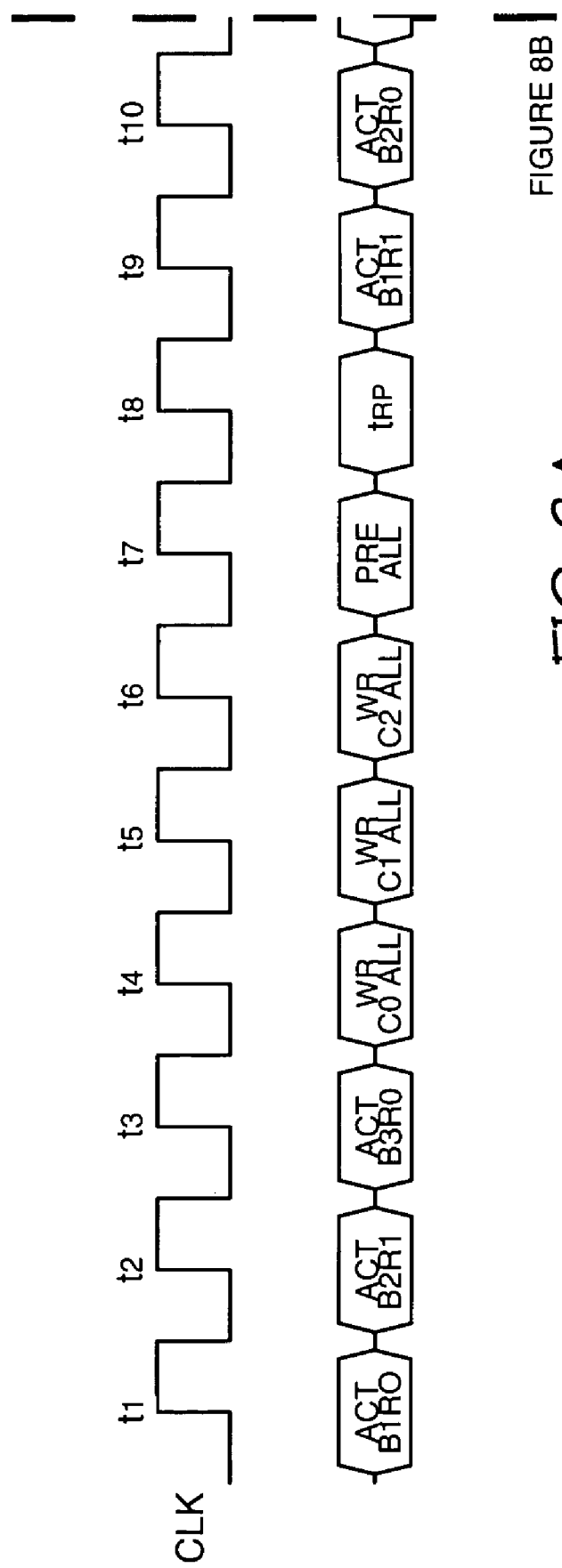

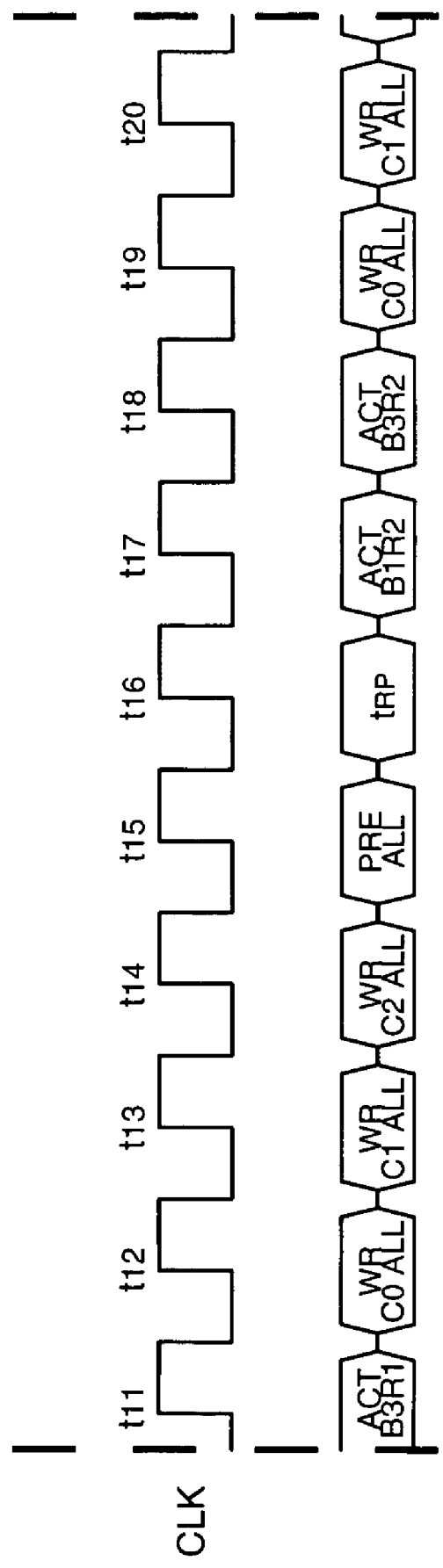

METHOD FOR WRITING TO MULTIPLE BANKS OF A MEMORY DEVICE

RELATED APPLICATION

This application is a continuation of U.S. application Ser. No. 10/338,331, filed Jan. 6, 2003, now U.S. Pat. No. 6,754,118, issued Jan. 22, 2004; which is a divisional of U.S. application Ser. No. 09/925,237, filed Aug. 8, 2001, now U.S. Pat. No. 6,529,429, issued Mar. 4, 2003; which is a continuation of U.S. application Ser. No. 09/546,683, filed Apr. 10, 2000, now U.S. Pat. No. 6,278,648, issued Aug. 21, 2001; which is a continuation of U.S. application Ser. No. 09/388,086, filed on Aug. 30, 1999, now U.S. Pat. No. 6,049,502, issued Apr. 11, 2000; which is a continuation of U.S. application Ser. No. 08/999,389, filed Dec. 29, 1997, now U.S. Pat. No. 5,959,929, issued Sep. 28, 1999.

TECHNICAL FIELD

The present invention relates to semiconductor memory integrated circuits. More particularly, the present invention relates to multi-bank or segmented array architecture, including synchronous random access memories, such as synchronous dynamic random access memories and as synchronous graphic random access memories.

BACKGROUND OF THE INVENTION

Although the current invention will work with any type of multi-bank or segmented array architecture, this specification focuses on synchronous dynamic random access memories (SDRAMs) for purposes of explaining the current invention. Nevertheless, it should be understood that the current invention applies to memory architectures such as video random access memories (VRAMs), synchronous graphic random access-memories (SGRAMs), Rambus memory systems, and Synchlink memory systems.

Synchronous memories such SDRAMs are designed to operate in a synchronous memory system, where input and output signals are synchronized to an active edge of a system clock (one exception in an SDRAM being a clock enable signal as used during power-down and self-refresh modes).

The address operations of an SDRAM are somewhat different from those of an asynchronous DRAM. In an asynchronous DRAM, once row and column addresses are issued to the DRAM and the row and column address strobe signals are deactivated, the DRAM's memory is automatically precharged and available for another access. An SDRAM, on the other hand, requires a separate command to precharge a row of storage cells within a memory array. Assuming an SDRAM has multiple banks and a memory cell in one of those banks has been addressed, that bank remains active even after the cell has been accessed. This occurs because an internal row address strobe is generated and maintains the active state of the addressed row. As a result, the last row accessed in a bank remains open until a PRECHARGE command is used to deactivate the open row and put the bank into a standby mode.

Thus, to accomplish an SDRAM transfer operation, an ACTIVE command is issued to register a row address, and a memory bank is selected to be accessed. Data is then transferred to or from the memory bank by registering the column address through a WRITE or READ command, respectively. Other memory banks may be subsequently accessed, but a PRECHARGE command directed to a bank is needed before registering another row on that bank. During a time $t_{RP}$ required to precharge a row in a bank, commands to other banks may be issued. As a result, the precharge time $t_{RP}$ is considered to be "hidden" by the commands to other banks.

Testing of SDRAM as well as other memories involves writing sample data to the banks, reading data from the banks, and comparing the output to the input. This can be a time-consuming process. Consequently, there is a continuing need to shorten test time. One such method in the prior art involves compressing row addresses, which allows more than one open row and therefore allows writing to more than one memory cell at a time. Similarly, column addresses may also be compressed. However, as more rows and columns are activated simultaneously, there is an increase in the current load on busses used to transmit the input and output data. The additional line noise on the busses caused by the increased current load can change the output. As a result, the test mode conditions may actually create errors that would not appear in a non-test mode. Thus, there is an additional need in the art for a faster test mode that will not contribute error-producing factors to the testing process. Moreover, concerning faster writing to multi-bank architectures, prior art teaches treating all banks as one large bank, wherein a row address accesses that row in all of the banks. It would be a benefit to the art to have the option to simultaneously write to any number of banks, including not only writing to one bank or all banks, but also to writing to more than one bank but less than all banks. It would be a further benefit to maintain the discrete nature of each bank by being able to write to one row of one bank and a different row of another bank with a single command.

SUMMARY OF THE INVENTION

Accordingly, the present invention provides a method of writing data to memory devices. One exemplary embodiment comprises a method that allows writing to a selection of banks in a synchronous memory device having multiple memory banks. The selectivity of this embodiment covers writing to one bank, all banks, or any number of banks in between.

Another exemplary embodiment provides additional selectivity; in activating a row for each bank designated to receive data, it is not required that the same row be activated in each bank. Rather, this embodiment allows for the activation of non-analogous rows in the banks. For example, the first row in one bank could be activated and the last row in another bank could be activated. The same data could then be written to both rows with a single command. Thus for purposes of quickly writing data, one row of one bank can be paired with rows of other banks that are designated to receive similar data. Writing data to the rows on different banks has the advantage of shortening test time without the disadvantage of creating error-producing line noise that is inherent in compressing data.

Nevertheless, the current invention is not limited to use apart from prior art methods of decreasing the time required for writing; another exemplary embodiment allows for use of multiple bank writing in conjunction with other time-saving writing modes such as page writing.

BRIEF DESCRIPTION OF THE DRAWINGS

FIGS. 1A and 1B illustrate a block diagram of an SDRAM circuit.

FIGS. 5A and 5B are timing diagrams illustrating the command sequence needed under one embodiment of the current invention in order to write data to two of the four banks depicted in FIG. 3.

FIGS. 8A through 8C are a timing diagram illustrating the command sequence needed under a third embodiment of the current invention in order to write data to three of the four banks depicted in FIG. 3.

DETAILED DESCRIPTION OF THE PREFERRED EMBODIMENTS

Figure 1A:
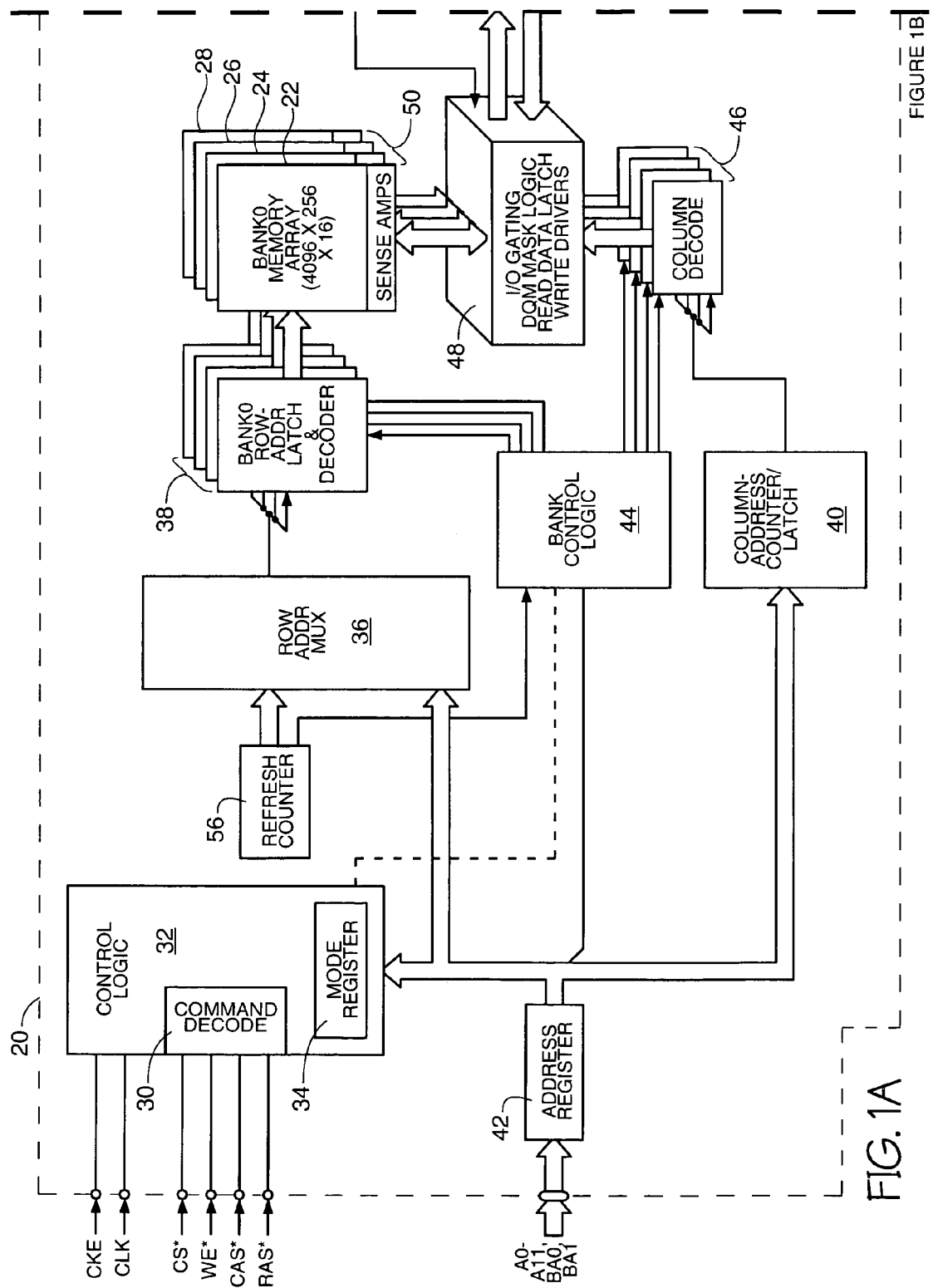

In order to describe embodiments of this invention, it is necessary to go into some detail of an exemplary memory system in which the current invention is used. FIG. 1, for example, depicts a block diagram of a 64 MEG SDRAM 20 organized as a 4 MEG×16 package, including a bank 0 memory array 22, a bank 1 memory array 24, a bank 2 memory array 26, and a bank 3 memory array 28. Each bank is logically arranged into sixteen planes, wherein one plane corresponds to each DQ input/output. Each plane, in turn, comprises storage cells organised in 4096 rows and 256 columns. This arrangement is demonstrated in FIG. 2, detailing bank 0 memory array 22 as an example for all banks 22,24,26, and 28. Much of the circuitry of SDRAM 20 is similar to the circuitry in known SDRAMs, such as the MT48LC4M16A1 S 4 MEG×16 SDRAM part made by Micron Technology, Inc. This part is described in detail in the Functional Specification reference included as part of the disclosure documents accompanying this application. Once again, it should be noted that this invention applies to other multi-bank memory systems, such as those disclosed in the annual DRAM Data Books from Micron Technology. Another example includes Synchlink-type memories (SLDRAMs), such as the 4 MEG×18 SLDRAM addressed in the functional specification submitted with this application. Still other applicable memories include Rambus memory systems (RDRAMs), such as those discussed in U.S. Pat. Nos. 5,511,024; 5,434,817; 5,430,676; and 5,390,308.

Returning to FIG. 1, power is supplied to SDRAM 20 through pins $V_{cc}$ and $V_{ss}$ (not shown). A system clock signal CLK is provided through a CLK input pin, and a clock enable signal CKE is provided through a CKE pin of SDRAM 20. The CLK signal activates and deactivates based on the state of the CKE signal. For purposes of explaining the present invention, it is assumed that all input and output signals of SDRAM 20, with the exception of the CKE signal during power-down and self-refresh modes, are synchronized to the positive-going edge of the CLK signal.

A chip select signal (CS*) is input through a CS* input pin. When CS* is low, it enables a command decoder 30. Command decoder 30 is included as a part of control logic 32 circuitry and receives control signals. These control signals include a row address strobe (RAS*), a column address strobe (CAS*), and a write enable signal (WE*). The command decoder 30 decodes RAS*, CAS*, and WE* to place the control logic 32 in a particular command operation mode. Two bank address signals (BA0, BA1) are provided to define which of the four banks of memory arrays should be should be addressed.

Address bits are provided by inputs A0 through A11. Inputs A0–A11, as well as BA0 and BA1, are stored in an address register 42 before they are sent to other portions of the SDRAM 20. During a WRITE operation, data to be stored is supplied to SDRAM 20 through input/output pins DQ0 through DQ15. During a READ operation, data is clocked out of SDRALM 20 through DQ0–DQ15. An input/output mask signal DQM is provided as an input mask signal for write operations and as an output enable signal during read operations, as discussed in further detail below.

Mode register 34 is a part of control logic 32 that defines the specific mode of operation of SDRAM 20. Based on the state of input signals CS*, RAS*, CAS*, and WE*, the mode register 34 will determine whether SDRAM 20 is in an ACTIVE, WRITE, READ, PRECHARGE, or REFRESH mode.

Before any READ or VIE commands can be issued to a memory bank, a row in that bank must be activated. This is accomplished through the ACTIVE command, which is initiated by low CS* and RAS* signals in combination with high CAS* and WE* signals occurring during the rising edge of the CLK signal. During the ACTIVE command, the state of the bank address signals BA0 and BA1 determine which of the memory banks 22, 24, 26, or 28 will be activated and addressed. Signals BA0 and BA1 are sent to bank control logic 44 circuitry through address register 42. Further, a value representing the row address is indicated by inputs A0–A11 and provided to row address multiplexer 36, again by way of address register 42. The row address multiplexer 36, in turn, provides the row address inputs to latch and decoder circuitry 38 corresponding to the appropriate memory bank as determined by the bank control logic 44. Accordingly, the latch and decoder circuitry 38 will latch the row address identified by inputs A0–A11, decode the row address, and activate one of the memory bank's 4,096 row lines corresponding to that address.

A subsequent ACTIVE command to a different row in the same bank can only be issued after the previous active row has been closed with a PRECHARGE command. However, a subsequent ACTIVE command issued to a row in another bank can be issued while the row in the previous bank remains active.

A valid WRITE command is initiated with the CS*, CAS*, and WE* signals low and the RAS* signal high on the rising edge of a CLK signal. Upon receiving a WRITE command, the column address counter/latch 40 receives through the address register 42 a value representing a column address as indicated by the state of inputs A0–A7. This value is sent to the appropriate column decoder 46, as determined by the bank control logic 44. Column decoder 46 activates the relevant columns in each plane of the chosen memory bank along with the appropriate sense amps 50 and I/O gating circuitry. This is accomplished through circuit block 48, which contains I/O gating, read data latch, and write driver circuitry. The data to be written to the cell addressed by the active row and column lines comes from DQ0–DQ15 through a data input register 54 as depicted in FIG. 1B. Circuit block 48, however, also contains DQM mask logic. As a result, writing to the memory array is subject to the state of the DQM input. Specifically, if the DQM signal is low, the corresponding data will be written to memory. Alternatively, if the DQM is high, the corresponding data inputs will be ignored, and a write will not be executed to the particular byte/column location.

A valid READ command is used to initiate a burst read access to an active row. The READ command is initiated with low CS* and CAS* signals and high RAGS* and WE* signals on the rising edge of the CLK, signal. In response to a READ command, the column address counter/latch 40 receives column address bits from inputs A0–A9 and holds that column address for a memory bank selected by the state of bank address signals BA0 and BA1. In response to the next CLK signal after the READ command, the column address counter/latch 40 latches the column address to the appropriate column decoder 46. The column decoder 46, in turn, activates the relevant columns in each plane of the chosen memory bank along with the appropriate sense amps 50 and I/O gating circuitry in circuitry block 48. As known in the art, the sense amps 50 and the I/O gating circuitry in circuitry block 50 operate to sense the data stored in the cells addressed by the active row and column decoder lines and to provide the selected sixteen bits of data from the chosen memory bank to the data output register 52 (FIG. 1B). With each progressive clock cycle, the column address counter/latch 40 increases the address by one, and the reading cycle begins again with the memory location. This cycle continues until the burst is completed or another command has been initiated to halt the burst READ. Data addressed by the READ command appears on pins DQ0–DQ15 subject to the status of the DQM signal. Specifically, DQM must be low for DQ0–DQ15 to provide valid data.

The control logic initiates a PRECHARGE command in response to low CS*, WE* and RAS* signals along with a high CAS* signal on the rising edge of a CLK signal. The PRECHARGE command deactivates and precharges the bank memory array selected by the state of the BA0 and BA1 signals at the time PRECHARGE is initiated. Thus, a previously accessed row in a bank can be deactivated and precharged so that another row in that bank may be refreshed or activated. However, because a row in a particular memory bank activates in response to an ACTIVE command and remains active until receiving a PRECHARGE command, consecutive READ and WRITE commands to the same row in a bank do not require intervening PRECHARGE commands. Once a memory bank has been precharged, it is in an idle state and must be reactivated before another READ or WRITE command is issued to that memory bank. Further, PRECHARGE may be used to precharge either one or all memory banks on the SDRAM 20. Individual bank precharging is performed if the value of input A10 is low at the time PRECHARGE is initiated. Given that state of A10, the values of BA0 and BA1 determine which individual memory bank is to be precharged. If, on the other hand, A10 is high when PRECHARGE is initiated, both BA0 and BA1 are treated as "don't care" values, and all banks are precharged accordingly.

An AUTO REFRESH command is used during normal operation of the SDRAM 20 and is initiated by registering CS*, RAS* and CAS* low with WE* high. The AUTO REFRESH command is non-persistent, and therefore must be issued each time a refresh is required. Addressing is accomplished through the use of a refresh controller (not shown) and a refresh counter 56 in a known manner This makes the address bits a "don't care" during the AUTO REFRESH command. The exemplary SDRAM 20 depicted in FIGS. 1A and 1B requires 4,096-AUTO REFRESH cycles every 64 microseconds. As a result, the SDRAM 20 provides a distributed AUTO REFRESH command every 15.6 microseconds to ensure that each row is properly refreshed. Alternatively, 4,096 AUTO REFRESH commands could be issued in a burst once every 64 microseconds.

A SELF REFRESH command can be used to retain data in the SDRAM 20, even if the rest of the system is powered down. When in the SELF REFRESH mode, the SDRAM retains data without external clocking. The SELF REFRESH command is initiated like an AUTO REFRESH command— CS*, RAS*, and CAS* low with WE* high—except that CE is disabled, thereby maintaining a low signal. Once the SELF REFRESH command is registered, all the inputs to SDRAM 20 become "don't cares" with the exception of CKE, as CKE must remain low.

Once the SELF REFRESH mode is engaged, SDRAM 20 provides its own internal clocking, causing it to perform its own AUTO REFRESH operations. As in the AUTO REFRESH mode, the addressing during SELF REFRESH mode is performed with refresh controller (not shown) and refresh counter 56. To exit SELF REFRESH mode, the system clock must be stable prior to CKE going high. Once CKE transitions to high, SDRAM 20 must have NOP commands issued for an amount of time required for completion of any bank memory array being internally refreshed. An NOP (no operation) command prevents unwanted commands from being registered during idle or wait states. Operations already in progress are not affected. The commands discussed above, as well as other commands, are further detailed in the Functional Specification and DRAM Data Books.

Figure 3:
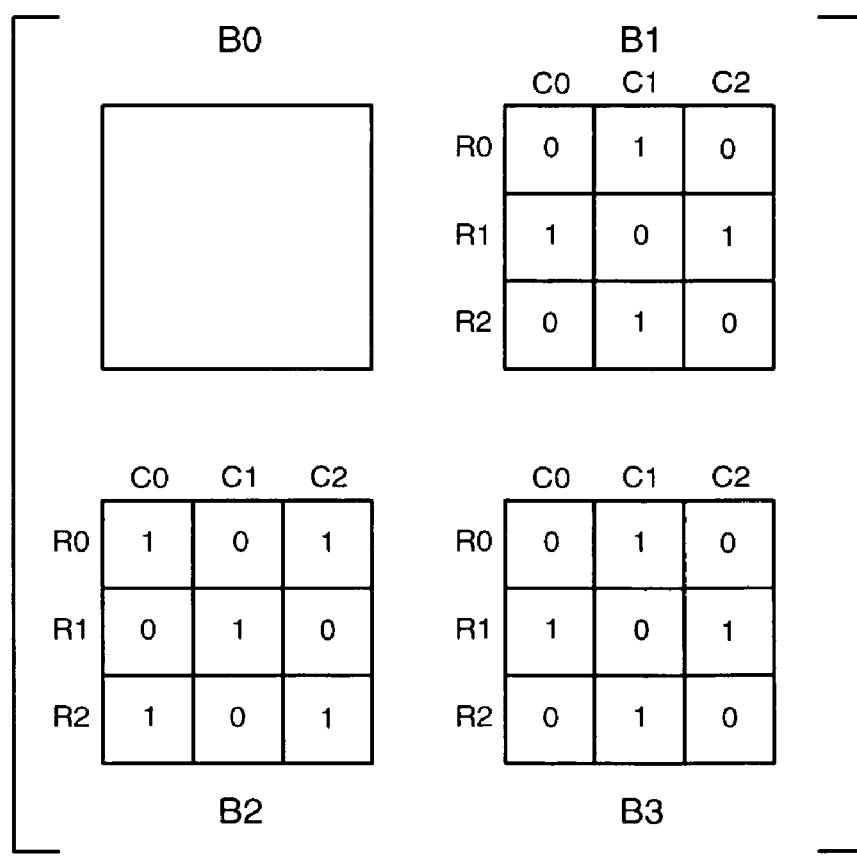
FIG. 3 represents four 3×3 banks of an SDRAM circuit and the data to be stored in two of the banks.

As part of testing the SDRAM, prior art teaches various methods of writing data to the memory banks. For purposes of simplicity, it is assumed that the SDRAM comprises four memory banks as seen in FIG. 3 (B0, B1, B2, and B3), wherein each bank has only three rows (R0, R1, and R2), three columns (C0, C1, and C2), and one "plane" as defined above and illustrated in FIG. 3. The ones and zeroes in banks B1, B2, and B3, represent data patterns that could be written to those banks. It is a standard practice to issue a PRE-CHARGED command to all banks before writing test data. This ensures that the only banks with activated rows are the ones intentionally activated during the subsequent command sequence. It should therefore be understood that such a PRECHARGE command is issued to the memory banks before writing data in test modes known in the prior art as well as those disclosed in this application. Therefore, there is no need in include this command in the command sequences addressed below.

Figure 4A:
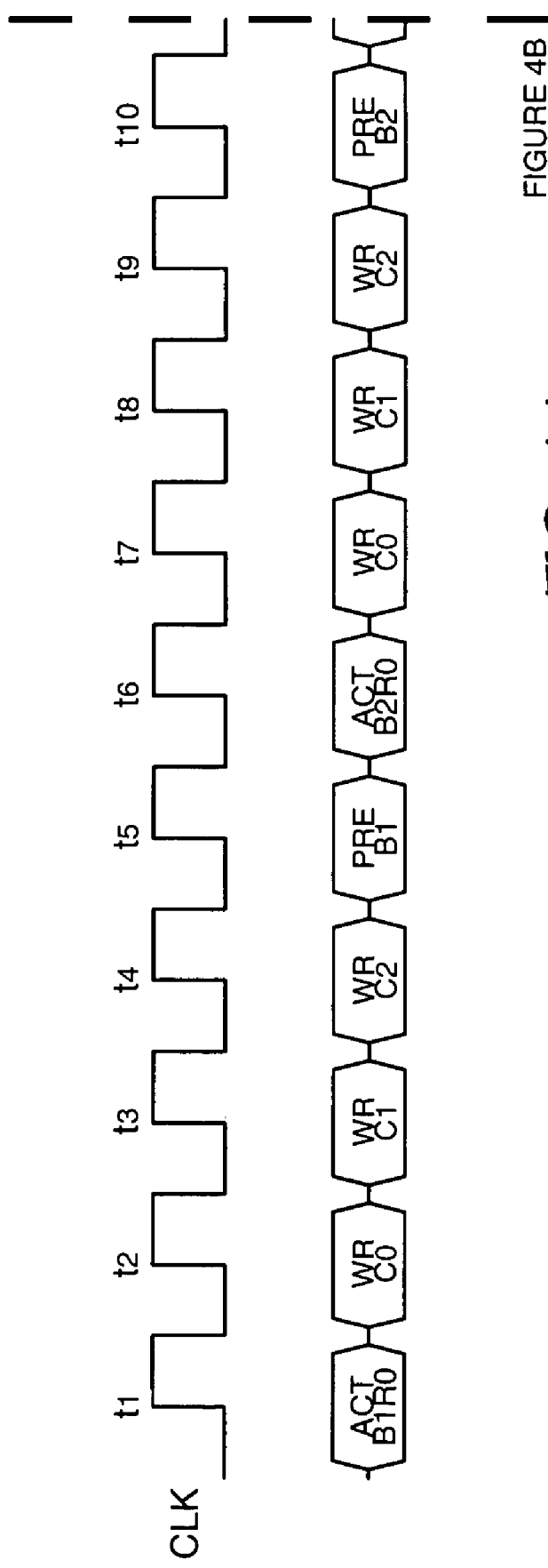
FIGS. 4A through 4C are a timing diagram illustrating the command sequence needed in the prior art to write data to two of the four banks depicted in FIG. 3.
Figure 4B:
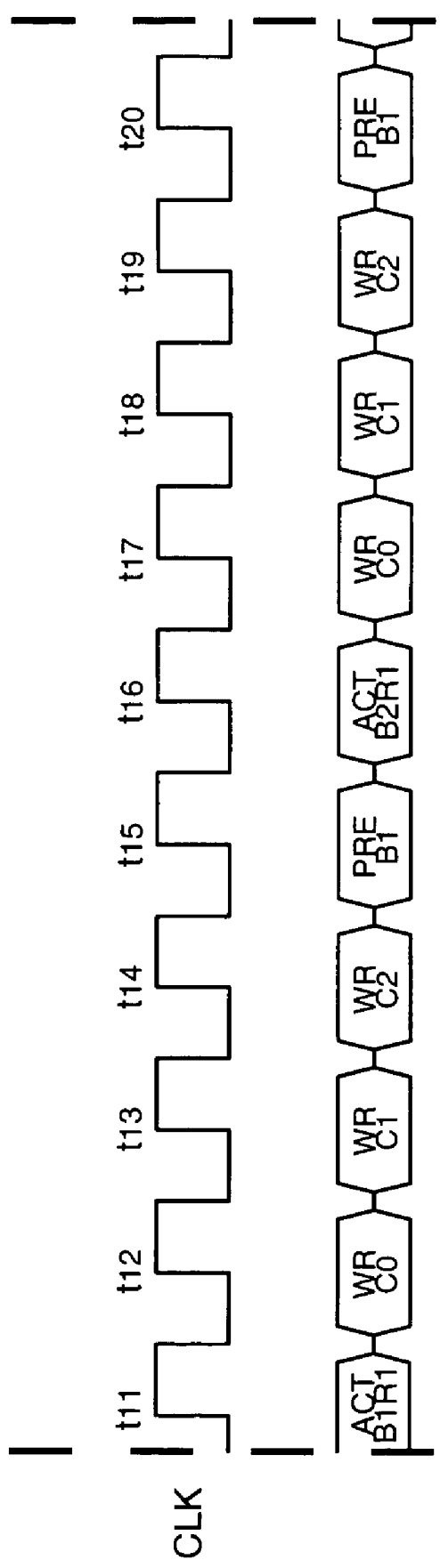
Figure 4C:
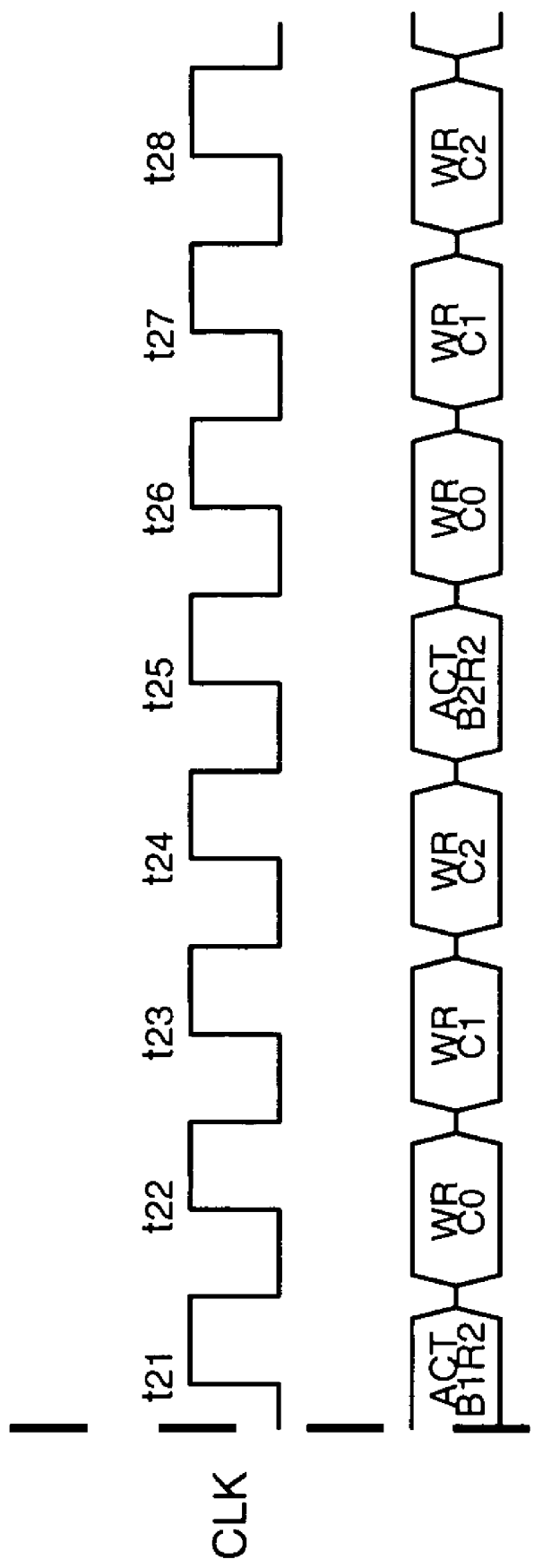

Assuming, for example, that it is desired to write only the data patterns in banks B1 and B2 to those banks, a prior art method of doing so is illustrated in FIGS. 4A—4C, wherein each command coincides with the rising edge of a clock pulse. FIG. 4A—4C demonstrates that the writing process requires (1) activating a particular row in one of the banks with the ACTIVE command, which is abbreviated to ACT in these figures; (2) issuing a WRITE (WR) command for each column in the row; and (3) issuing a PRECHARGE (PRE) command in order to activate the next row in the bank. This series of commands is applied to row R0 of bank B1 during clock cycles $t_1$ through $t_5$. In order to hide the precharge time $t_{RP}$ resulting from the PRE command at time $t_5$, bank B2 is subsequently activated and written to. As a result, the data illustrated in FIG. 3 is written to banks B1 and B2 in twenty-eight clock cycles. Assuming a duration of thirty nanoseconds between the rising edges of the CLK pulses, this task would take 840 ns. Other prior art methods of writing data, such as compression, may speed up the writing process, but they lead to the problems discussed above.

One embodiment of the current invention provides a faster way of writing the data to the memory banks by taking advantage of the fact that a row in each memory bank can remain active once accessed. Given this feature, the SDRAM can enter into a mode wherein data can be written to multiple memory banks at one time. In this exemplary embodiment, multiple bank writing is accomplished by activating a particular row in each of the banks designated to receive data. At the time a WRITE command is issued, input A10 is set to transmit a high signal. As a result, the bank address inputs BA0 and BA1 are treated as "don't care" values and the data from DQ inputs is written to all banks having active rows.

Figure 5B:
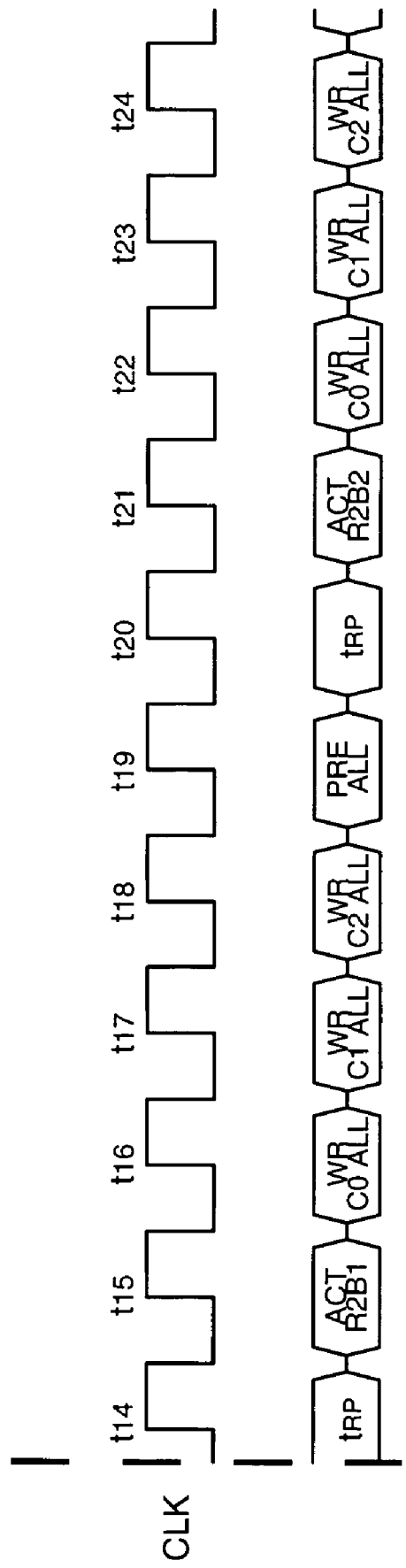

One exemplary application of this inventive method is demonstrated in FIGS. 5A and 5B. In writing the same data disclosed in FIG. 3 to the same banks B1 and B2, one advantage of this embodiment becomes clear with the first two commands issued. At time $t_1$, which coincides with the rising edge of the first clock pulse, the command is issued to activate row R0 of bank B1. As seen in FIG. 3, row R0 is intended to store a "0" in column C1, a "1" in C2, and a "0" in C3. Because it is desired to write to multiple banks simultaneously, it would be preferable to write to a row in bank B2 that will store the same or similar values. Fortunately, the current embodiment is not limited to choosing the same row for each bank; rather, the rows of each bank may be compared to the rows in other banks to determine optimal row-matching between banks. For example, row R1 of bank B2 is designated to store the same data in the same columns as bank B1. Thus, at time $t_2$, row R1 of bank B2 is activated. At time $t_3$, a write command WR is issued to column C0 of all banks by transmitting a high "don't care" bank address signal to A10. Because only the desired banks B1 and B2 are activated, data is simultaneously written to those banks and only to those banks. Transmitting data to the rows is completed after issuing two more write commands. All banks are subsequently precharged. After a $t_{RP}$ delay, another row in each of the two banks is chosen, wherein the rows will store the same values. Once again, it is not necessary that the rows be analogous. Accordingly, row R1 of bank B1 is activated at time $t_8$, while row R0 of bank B2 is activated at time $t_9$. Next, data is written to columns C0, C1, and C2 of all activated rows at times $t_{10}$, $t_{11}$, and $t_{12}$, respectively. After another PRE command, which precharges all banks during another precharge delay $t_{RP}$, the remaining row in each bank is written to. Row R2 of bank B1 is activated at time $t_{15}$, and commands to write to C0, C1, and C2 of all banks follow. Again, because bank B1 is the only bank active, the "write all" command writes only to that bank. Once all banks have been precharged, row R2 of bank B2 is then activated and written to. The total time needed to write to the two banks, assuming the $t_{RP}$ delays take up to 30 ns, is twenty-four clock cycles, or 720 ns. This represents a savings of four clock cycles or 120 ns.

Figure 6A:
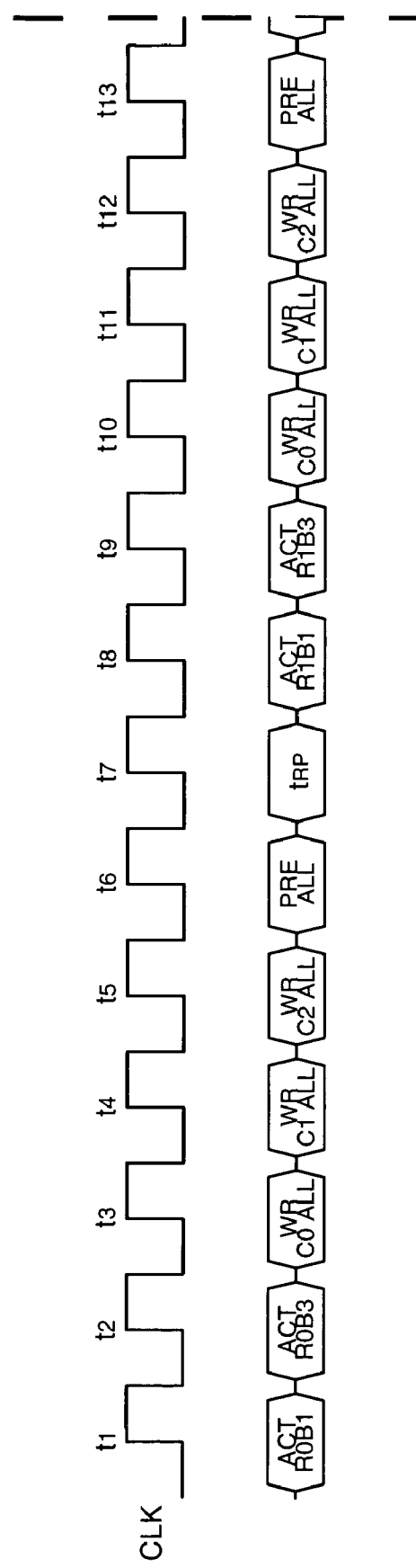
FIGS. 6A and 6B are a timing diagram illustrating the command sequence needed under a second embodiment of the current invention in order to write data to two of the four banks depicted in FIG. 3.
Figure 6B:
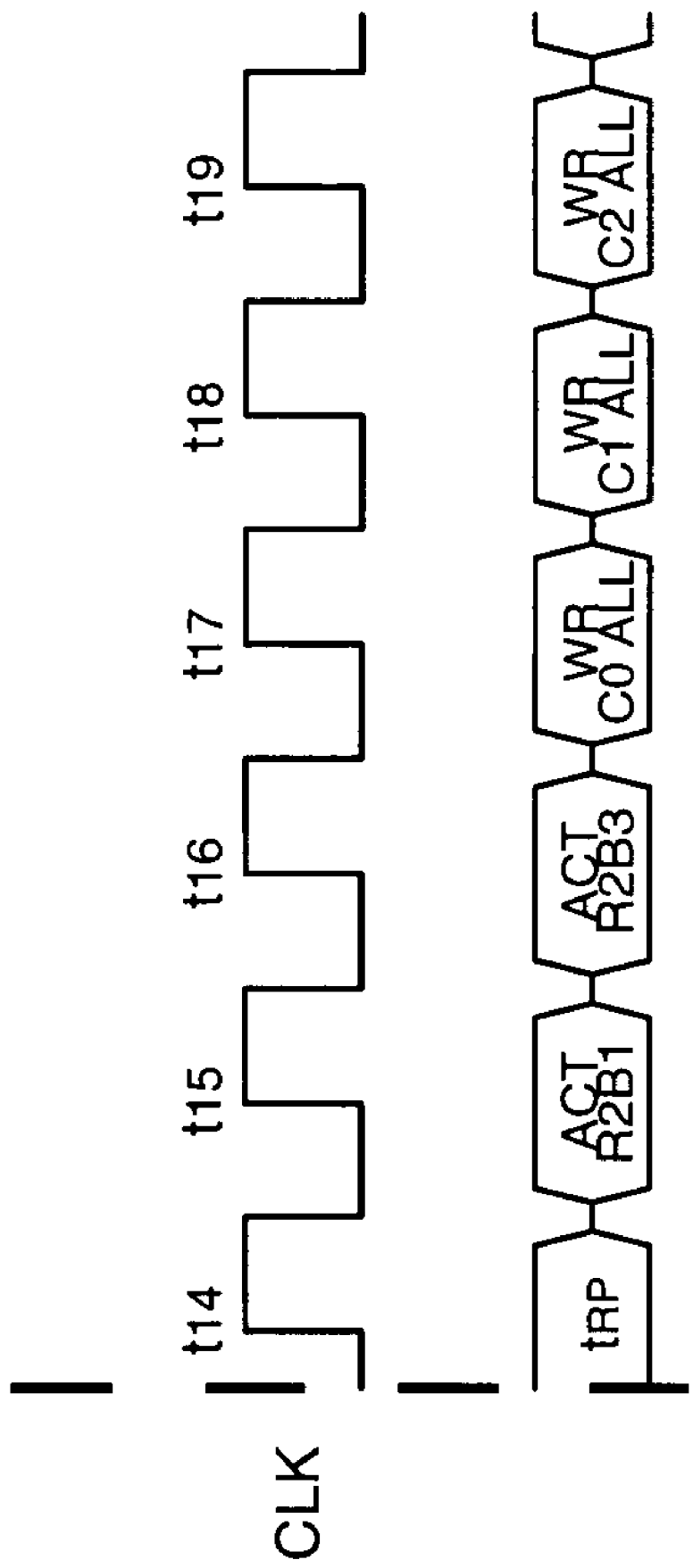
Figure 7A:
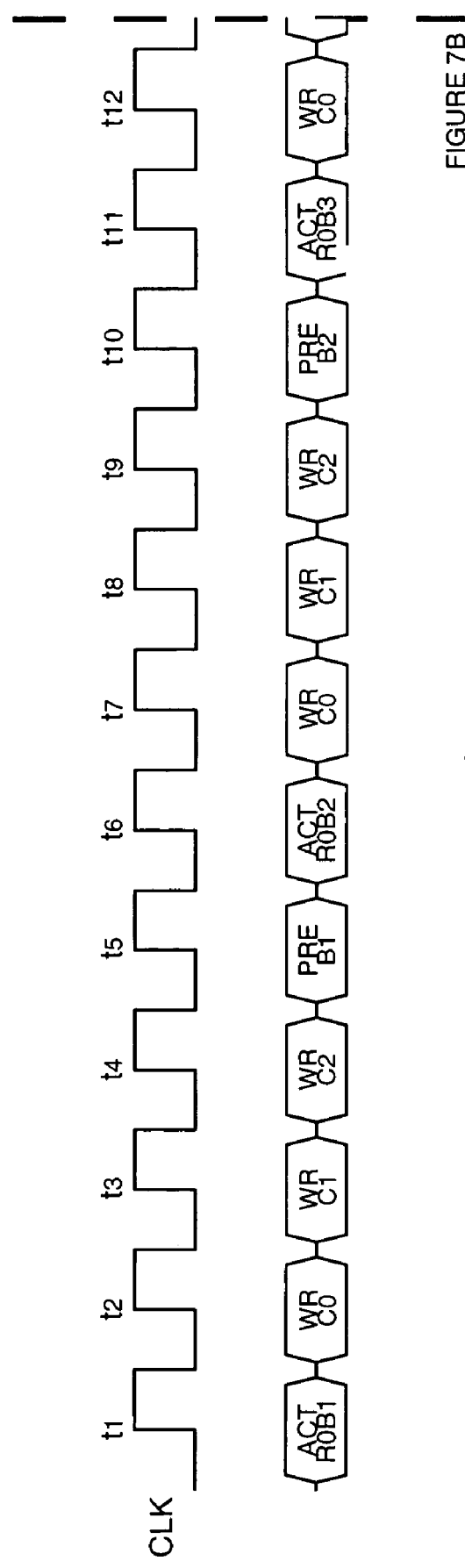
FIGS. 7A through 7D are a timing diagram illustrating the command sequence needed in the prior art to write data to three of the four banks depicted in FIG. 3.
Figure 7B:
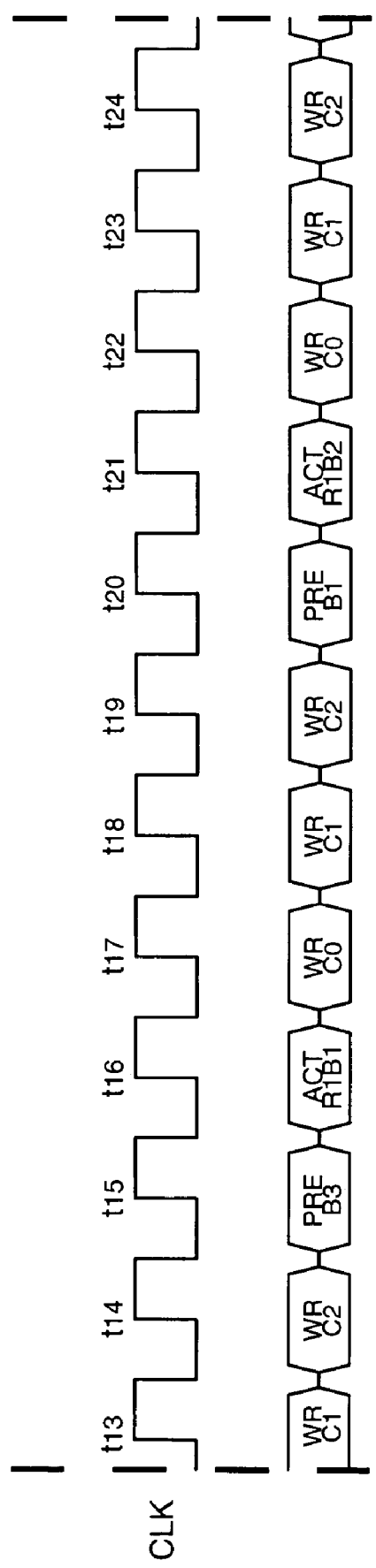
Figures 7C, 7D:
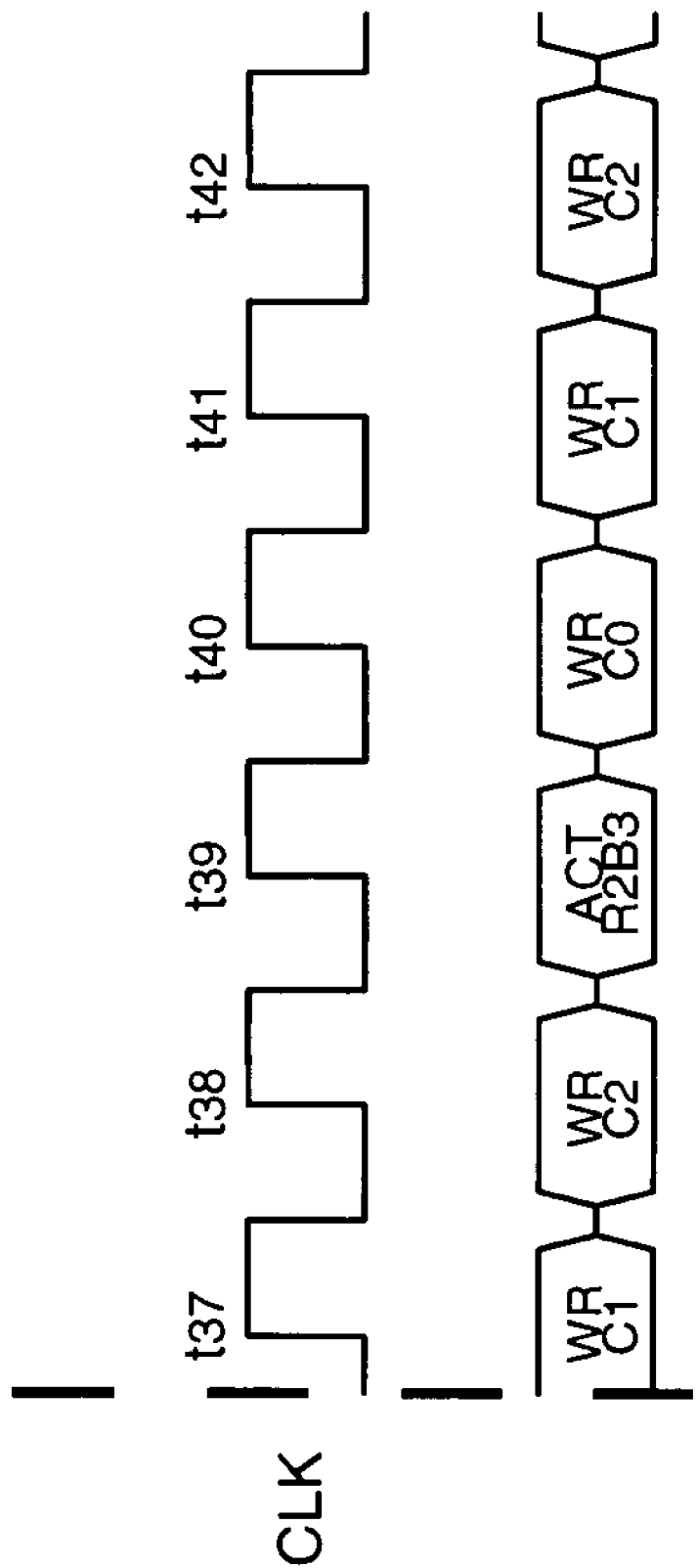
Figure 8C:
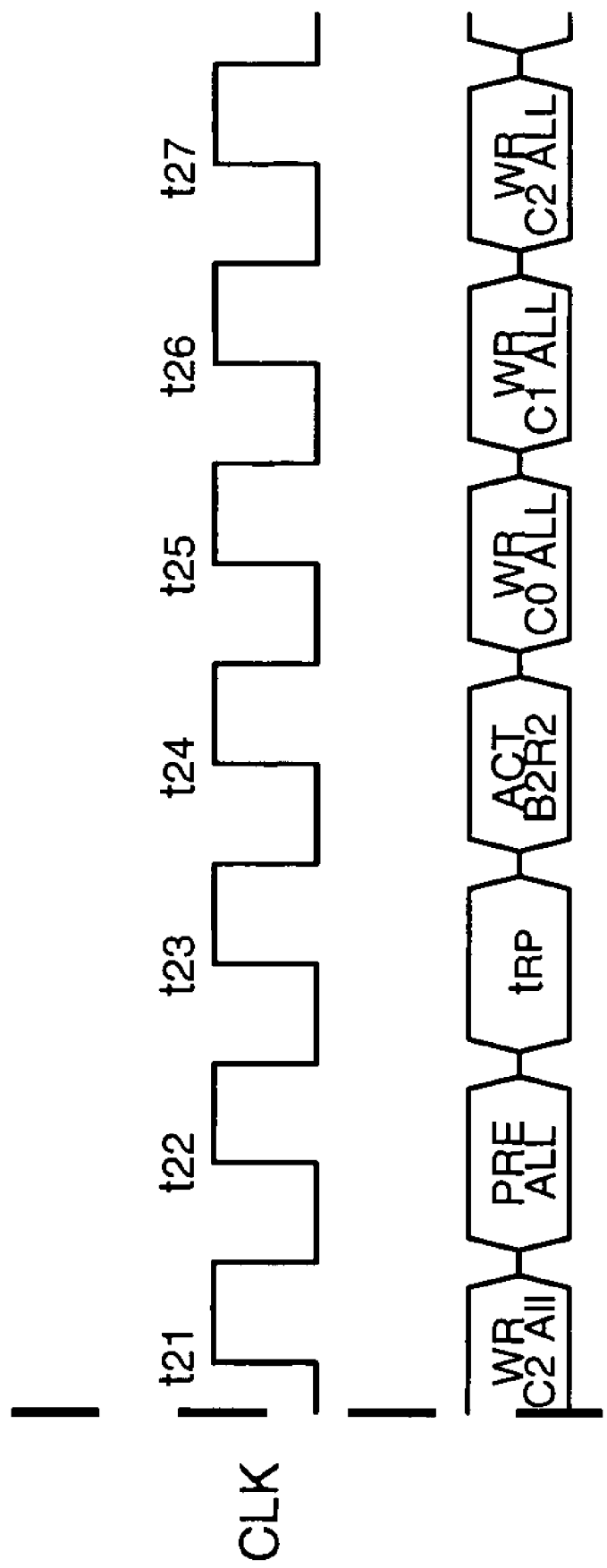

As another example, it is assumed that it is desired to write to banks B1 and B3, which contain the same data in their analogous rows. Under the prior art method described above and disclosed in FIGS. 4A—4C, it would still take twenty-eight clock cycles to write the data. Under an embodiment of the current invention illustrated in FIGS. 6A and 6B, one row in bank B1 can be activated along with a row in bank B3 having the same data, and data can be written to both simultaneously. At time $t_1$, row R0 of bank B1 is activated, while at time $t_2$, the analogous row R0 of bank B3 is activated. One skilled in the art can appreciate, however, that the non-analogous row R2 could have just as easily been chosen. Regardless, the next three clock cycles $t_3$, $t_4$, and $t_5$, are used to write data to all activated rows. Including a PRE command to all banks and an accompanying $t_{RP}$ delay, it takes seven clock cycles to write data to one row of both banks. Similarly, it take another seven cycles, $t_8$ to $t_{14}$, to write to the second row in both banks. Because a PRE command is not needed to write to the final row, only five additional clock cycles, $t_{15}$ to $t_{19}$, are needed. Ultimately, only nineteen clock cycles, or 570 ns, are needed.

Figure 2:
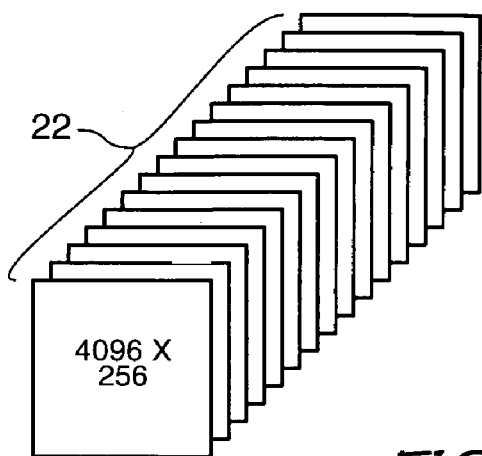
FIG. 2 represents a memory bank of the SDRAM circuit in FIG. 1.

Given the time saved for two banks having a 3×3 configuration, one skilled in the art can appreciate how the amount of time saved increases significantly as the size of arrays increases to dimensions such as the 4096×256 arrays in FIG. 1A and greater. Time savings will also increase as the number of arrays accessed at one time increases. This is shown in by comparing FIGS. 7A—7D to FIGS. 8A—8C. FIGS. 7A—7D demonstrate the prior art commands used for writing the data indicated in FIG. 3 to three banks B1, B2, and B3. Fifteen clock cycles, $t_1$ to $t_{15}$, are needed to write to the first row of all three banks. An additional fifteen clock cycles, $t_{16}$ to $t_{30}$, are used to write to the second row in all three banks. Writing to the third row in each bank takes only twelve clock cycles, as there is no need to precharge the banks while writing to the final row. Ultimately, it takes 42 clock cycles, or 1,260 ns to write to three banks.

In comparison, one embodiment of the current invention takes only eight clock cycles, $t_1$ to $t_8$, to write to row R0 of bank B1, row R1 of bank B2, and row R0 of bank B3. Further, it takes eight more clock cycles, $t_9$ to $t_{16}$, to write to row R1 of bank B1, row R0 of bank B2, and row R1 of bank B3. After that, there is no one row's worth of data that is common to all three banks. However, because the data in row R2 of banks B1 and B3 are identical, clock cycles $t_{17}$ to $t_{23}$ are used to write that data to those rows. The remaining row R2 of bank B2 is written to in four more clock cycles, resulting in a total of twenty-seven clock cycles, or 810 ns, needed to write to the three banks. This demonstrates a savings of fifteen clock cycles or 450 ns over the prior art.

It should be noted that, although the A10 input has been designated to trigger the "don't care" mode concerning the bank addresses, other control signals could be used to do so in this and other multi-bank memory systems. Moreover, as an alternative to the method above of selecting a number of banks, which involved precharging all banks and activating particular rows of particular banks, it should be further noted that control signals to other inputs could be used to select a particular number of banks for writing. For example, a combination of inputs could be used to make only one of the bank address signals, BA0 or BA1, a "don't care value. Two or three banks could also be chosen based on the status of a combination of any number in inputs, such as A10, BA0, BA1, and CKE, for example.

Figure 9:
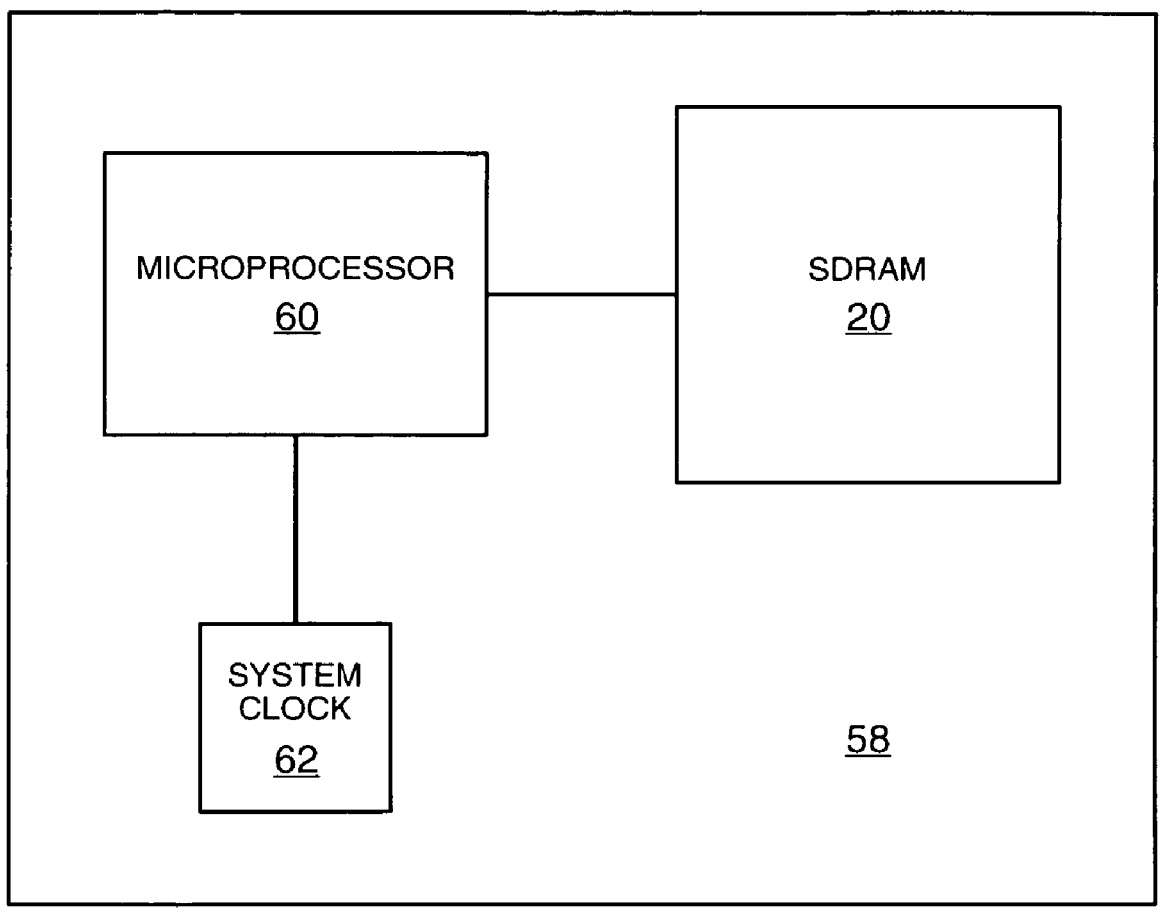
FIG. 9 is a block diagram of a computer system accommodatable by the present invention.

Thus, the present invention allows for accommodating systems using multi-bank memory circuits, such as computer systems using SDRAMs. FIG. 9 illustrates such a computer system 58, wherein a microprocessor 60 transmits address, data, and control signals to the SDRAM circuit 20. A system clock circuit 62 provides timing signals for the microprocessor 60. As one example of the current invention's ability to accommodate the computer system, the inventive method described above could be used to quickly test the SDRAM 20 either before or after packaging the SDRAM as part of the computer system 58.

One skilled in the art can appreciate that, although specific embodiments of this invention have been described above for purposes of illustration, various modifications may be made without departing from the spirit and scope of the invention. For example, the present invention is not limited to use with the 64 MEG SDRAM discussed above. Rather, the present invention also applies to a 16 MEG SDRAM having two memory banks as well as other SDRAMs having more than four banks. In addition, the present invention is not limited to applications involving SDRAMs, as the invention applies to other devices wherein memory has been segmented into multiple banks, including memories made by Synchlink and Rambus.

In addition, although the current invention provides an alternative to prior art methods of writing data, this invention can also be used in cooperation with the prior art methods. For example, the multiple block write method disclosed above could be used in combination with a page write scheme. Further, in addition to establishing "don't care" values for the bank address inputs, the current invention covers other test modes of operation for the SDRAM that would allow simultaneously writing to multiple banks. Accordingly, the invention is not limited except as stated in the claims.

What is claimed is:

1. A method of operating a plurality of memory banks, comprising:
    activating a first row in a first memory bank, wherein said first row has a first address;
    precharging said first row after activating said first row;
    activating a second row in a second memory bank before precharging said first row, wherein said second row has a second address distinct from said first address; and
    simultaneously writing to said first row and said second row before said precharging said first row.

2. A method of processing multiple rows in multiple banks of a memory chip, comprising:
    activating a first row in a first bank of said memory chip, said first row having a first address, wherein said act of activating a first row comprises activating said first row in response to said memory chip receiving an external row address signal;
    avoiding automatically precharging said first row after said receiving said external new address signal;
    activating a second row in a second bank, said second row having a second address, wherein said act of activating a second row occurs while said first row is active; and
    simultaneously writing to said first row and said second row.

3. The method of claim 2, wherein said avoiding act comprises generating an internal row address signal.

4. The method of claim 3, further comprising maintaining said internal row address signal until reception of an external precharge command for said first row.

5. A method of preparing a memory device for use, comprising:
    activating a first address in a first memory bank of said memory device;
    activating any address in a second memory bank of said memory device while said first address of said first memory bank is active, wherein said any address is not restricted to being the same as said first address; and
    simultaneously writing to said first address and said any address in said second memory bank before precharging said first address.

6. The method of claim 5, wherein said act of activating any address comprises activating an address in said second memory bank that is different from said first address.

7. The method of claim 6, wherein said act of activating a first address comprises activating a first row address.

\* \* \* \* \*